United States Patent [19]

Miyamoto et al.

[11] Patent Number: 5,239,207
[45] Date of Patent: Aug. 24, 1993

[54] SEMICONDUCTOR INTEGRATED CIRCUIT

[75] Inventors: Junichi Miyamoto; Nobuaki Ohtsuka, both of Yokohama, Japan

[73] Assignee: Kabushiki Kaisha Toshiba, Kawasaki, Japan

[21] Appl. No.: 653,369

[22] Filed: Feb. 11, 1991

[30] Foreign Application Priority Data

Feb. 13, 1990 [JP] Japan .................................. 2-29685

[51] Int. Cl.[5] .............................................. H03K 3/01
[52] U.S. Cl. ............................... 307/296.1; 307/296.6; 307/296.8; 307/264
[58] Field of Search ............... 307/296.1, 296.6, 296.8, 307/264; 365/203

[56] References Cited

U.S. PATENT DOCUMENTS

| | | | |
|---|---|---|---|
| 4,686,387 | 8/1987 | Rumelhard | 30/296.1 |
| 4,935,644 | 6/1990 | Tsujimoto | 307/296.1 |
| 4,954,769 | 9/1990 | Kalthoff | 307/296.1 |

OTHER PUBLICATIONS

"The Design and Analysis of 'VLSI Circuits'", Lance A. Glasser & Daniel W. Dobberpuhl, p. 229, FIG. 4.69.

*Primary Examiner*—Robert J. Pascal
*Assistant Examiner*—R. A. Ratliff
*Attorney, Agent, or Firm*—Banner, Birch, McKie & Beckett

[57] ABSTRACT

A semiconductor integrated circuit comprises a first MOS transistor, a capacitor element, a second MOS transistor, and a node. One current path of the first MOS transistor is connected to a first power source, and the gate and the other current path thereof are connected together. The capacitor element is connected between a second power source and the other current path of the first MOS transistor. The second MOS transistor is of the same conductivity type as the first MOS transistor. One current path of the second MOS transistor is connected to the first power source, and the gate thereof is connected to the gate of the first MOS transistor. The node is connected to the other current path of the second MOS transistor. The node is pre-charged at a predetermined potential level by a current flowing from the other current path of the second MOS transistor.

3 Claims, 4 Drawing Sheets

SEMICONDUCTOR INTEGRATED CIRCUIT

BACKGROUND OF THE INVENTION

Field of the Invention

The present invention relates to a semiconductor integrated circuit wherein a given node is set at a predetermined potential level when the power source is turned on. For example, it relates to a CMOS (complementary insulated gate type) circuit which is incorporated in a semiconductor memory and in which a node connected to a nonvolatile memory cell is set at a predetermined potential level when information representing a defective address is stored in the nonvolatile memory of a redundancy circuit. When the phrase "to store information representing a defective address" is used herein, it refers to the act of storing information about a defective memory cell of a semiconductor memory into a redundancy circuit.

FIG. 1 shows a circuit which is incorporated in a conventional semiconductor memory and is used for setting data on a defective address in a redundancy circuit. In FIG. 1, "Vcc" denotes a power source potential, "Vss" denotes a ground potential, "31" denotes a polysilicon fuse, "32" and "33" denote capacitors, "34" and "35" denote CMOS inverters, "36" denotes a pull-up p-channel MOSFET (metal oxide semiconductor field effect transistor) which is cross-coupled to the CMOS inverter 34, and "37" denotes a resistor which forms a latch circuit 38 in cooperation with the pull-up transistor 36.

In the circuit shown in FIG. 1, the fuse 31 is blown in accordance with the one-bit data (namely, data "1" or "0") of a defective address of a redundancy circuit. The term "defective data (address)" is used herein to refer to the data representing that memory cell included in a semiconductor memory cell which becomes defective for some reason or other. When the fuse 31 is in an electrically-connected state, input node A of the latch circuit 38 is at the "L" (low) level. If the fuse 31 is blown and is therefore in an electrically-disconnected state, node A is pre-charged and set at the "H" level due to capacitive coupling, when the power source "Vcc" of the memory is turned on. Simultaneous with this, output node B is pre-charged and set at the "L" level. This state is maintained by the latch circuit 38 until the power source is turned off.

A circuit employing the above polysilicon fuse is disadvantageous, in that a laser-irradiating device or the like is required to blow the fuse 31 and in that one redundancy circuit cannot be switched to another after the chip of the memory is sealed within a package.

To eliminate these disadvantages, the redundancy circuit shown in FIG. 2 is proposed, which circuit employs a nonvolatile memory element constituted by an EPROM cell 41 (i.e., a read-only memory cell which is erasable and programmable upon irradiation of ultraviolet rays). As is shown in FIG. 2, the EPROM cell 41 is made up of a storage transistor 42 and a selection transistor 43. The storage transistor 42 is connected to a point set at a ground potential (Vss), while the selection transistor 43 is connected to input node A of a latch circuit 38 which is similar to that employed in the circuit shown in FIG. 1. In FIG. 2, like reference numerals and symbols represent like structural elements used in the circuit shown in FIG. 1.

In the circuit shown in FIG. 2, however, the parasitic capacitance of node A with reference to the ground potential (Vss) point is caused by the source and drain of the selection transistor 43 and by the drain of the storage transistor 42. Thus, the capacitance of node A is greater in the FIG. 2 circuit than in the FIG. 1 circuit. When the EPROM cell 41 is in the erased state (i.e., an ON state), node A is set in the "L" level without any problem. However, when the EPROM cell 41 is in the data-written state and its gate threshold voltage Vth is high (i.e., an OFF state), a great capacitance is required between node A and the power source potential (Vcc) point, in order for node A to be pre-charged into the "H" level. In the case of a 4M-bit EPROM, for example, 10 bits are necessary to record one address. If a memory incorporates eight redundancy circuits for low addresses, it is necessary to provide as large as 80 wide-area capacitors in correspondence to 80 EPROM cells. To provide so many wide-area capacitors is almost impossible in practice.

This problem may be solved by additionally employing a pulse-generating circuit which generates pulses when the power source is turned on and by permitting node A to be pre-charged by the pulse-generating circuit. An example of a circuit incorporating such a pulse-generating circuit is shown in FIG. 3. In the circuit shown in FIG. 3, a pre-charging p-channel MOS transistor 51 for precharging node A is connected between node A and a power source potential (Vcc) point. The gate of this pre-charging transistor 51 is supplied with an output of a pulse-generating circuit 52 when the power source is turned on. In FIG. 3, like reference numerals and symbols represent like structural elements used in the circuit shown in FIG. 2.

The fundamental operation of the FIG. 3 circuit is similar to that of the FIG. 2 circuit. When the power source is turned on, the pulse-generating circuit 52 shown in FIG. 3 operates as follows. The level of output node Q of a flip-flop 53 rises in such a manner that it follows the rise in the power source. A voltage at that level is applied to inverter 56 through two inverters 54 and 55. It is also applied to a delay circuit 57. After a certain time has elapsed, an n-channel transistor 58 is turned on, due to the output level of the delay circuit 57. As a result, node Q is returned to the "L" level. The flip-flop 53 maintains this state until the power source is turned off. Accordingly, a pulse which is kept at the "H" level during a short period of time is output from the inverter 55 when the power source is turned on.

The operation mentioned above is illustrated in the graphs shown FIGS. 4A and 4B. Where the power source rises in a short time, as is indicated in FIG. 4A, no problem occurs. However, where the power source does not rise in a short time or in a uniform manner, the pulse generation may be stopped before sufficient-voltage pulses are output from the inverter 55. Since the absolute value of the waveform amplitude at node Q corresponds to the source-gate voltage of the precharging p-channel transistor 51, it may happen in the worst case that the pulse generation will stop before the pre-charging transistor 51 is turned on. Needless to say, no problem occurs if the delay time provided by the delay circuit 57 is sufficiently longer than the rise time of the power source. However, the delay time cannot be lengthened without greatly increasing the pattern area. In addition, it is difficult, from the viewpoint of design, to determine the maximal value of the rise time of the power source.

As mentioned above, the conventional semiconductor integrated circuit has problems, in that if the power source does not rise quickly or uniformly, the generation of pulses stops before the pulses come to have a sufficiently high voltage, and in that a given node of the integrated circuit cannot therefore be set at a desirable potential level.

SUMMARY OF THE INVENTION

Accordingly, an object of the present invention is to provide a semiconductor integrated circuit wherein a given node is reliably set at a desirable potential level even if the power source rises in any manner.

To achieve this object, the present invention provides a semiconductor integrated circuit comprising: a first MOSFET which has a source connected to a first power source, and a gate and a drain connected to each other; a plurality of second MOSFETs which are of the same conductivity type as the first MOSFET and each of which has a gate connected to the gate of the first MOSFET, a source connected to the first power source, and a drain connected to a predetermined node and set at a desirable potential level; and a capacitor connected between the drain of the first MOSFET and a second power source.

Before the semiconductor integrated circuit is turned on, the connection point between the drain of the first MOSFET and the capacitor is at the same potential level as the second power source. When the semiconductor integrated circuit is turned on, the potential difference between the power source and the connection point becomes greater than the threshold voltage of the first MOSFET. Since, therefore, the first MOSFET is turned on, either a charging current or discharging current flows through the capacitor. Assuming that the first MOSFET and each second MOSFET are of the same size, the same amount of current as that flowing through the first MOSFET flows from each second MOSFET to the connection point. Accordingly, the connection point is charged or discharged and has a desirable potential level.

As is understood from the above, the integrated semiconductor device of the present invention permits a given node therein to be set at a desirable potential level even if the power source voltage rises in any manner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described in detail, with reference to FIGS. 5 and 6 of the accompanying drawings.

Figure 5:
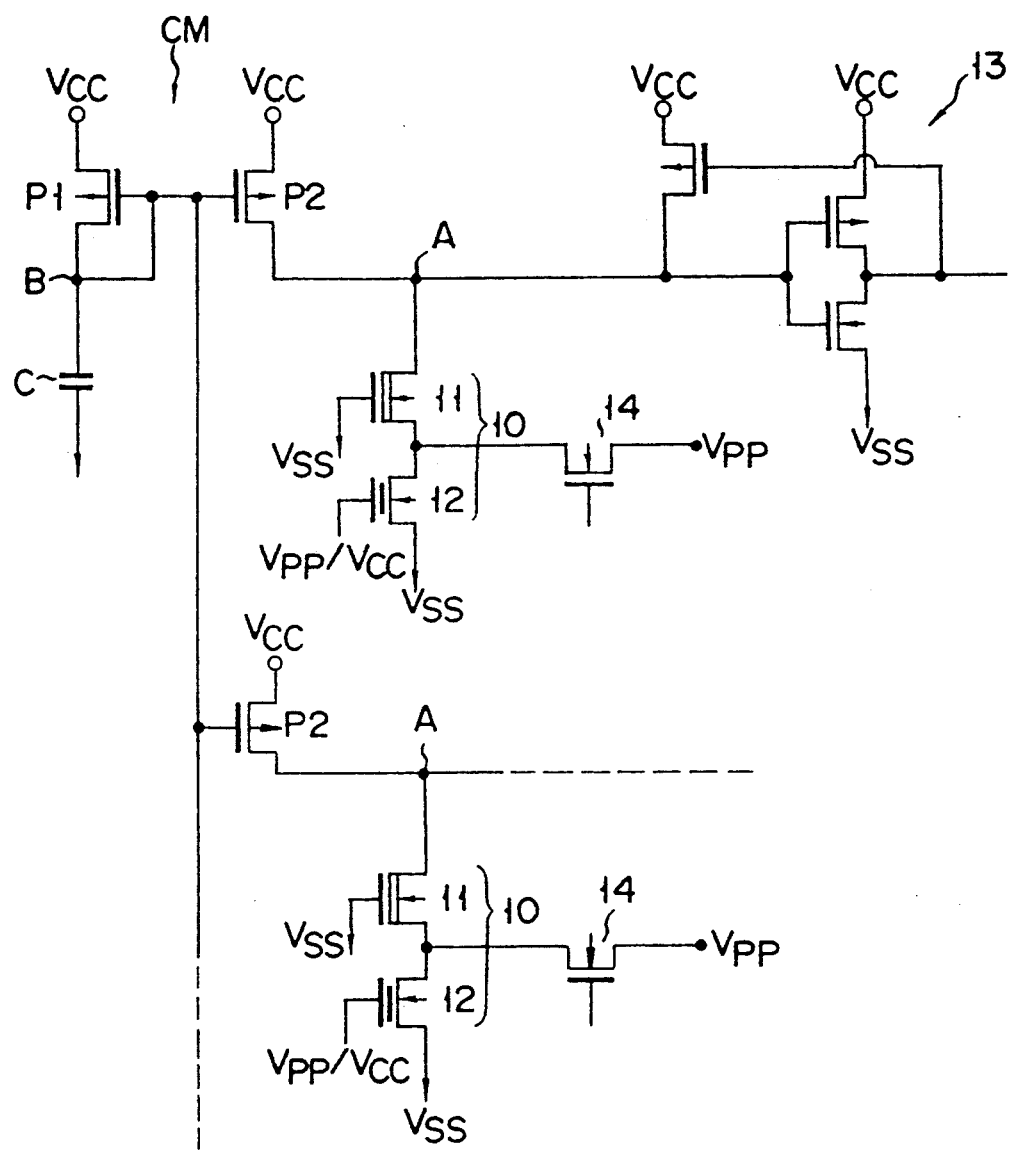
FIG. 5 is a circuit diagram showing a semiconductor integrated circuit according to the first embodiment of the preset invention.

FIG. 5 shows part of a redundancy circuit of a semiconductor memory in which the semiconductor integrated circuit of the present invention is embodied. In FIG. 5, reference symbol P1 denotes a first p-channel MOS transistor. The source of this MOS transistor is connected to a first power source Vcc (which functions as a power source potential point in this embodiment), and the gate and drain thereof are connected to each other. Reference symbol P2 denotes a plurality of second p-channel MOS transistors which are of the same conductivity type as the first MOS transistor P1. The gate of each second MOS transistor is connected to the gate of the first MOSFET P1, the source thereof is connected to the first power source Vcc, and the drain thereof is connected to a predetermined node A and is set at a desirable potential level. Reference symbol C denotes a capacitor connected between the drain of the first MOS transistor and a second power source Vss (which functions as a ground potential point in this embodiment). The two p-channel MOS transistors P1 and P2 jointly constitute a current mirror circuit CM.

EPROM cells 10 are connected between the node A and the ground potential point Vss, so as to store data on a defective address. Each EPROM cell 10 is made up of two transistors connected in series, namely, an n-channel MOS transistor 11 used for mode selection and an n-channel floating gate transistor 12 used for data storage. The MOS transistor 11 determines the voltage level at the drain of the cell 10 when data is read, and prevents the node A from being applied with a high voltage when data is written. The drain of selection transistor 11 is connected to the node A, and the source of storage transistor 12 is connected to the ground potential point Vss. In the case where a depletion-type MOS transistor is employed as selection transistor 11, its gate is connected to the ground potential point Vss. The number of second p-channel MOS transistors P2, the number of EPROMs 10 and the number of write transistors 14 (to be mentioned later) are determined in accordance with input row/column address signals and the number of redundant rows/columns.

In the case where an enhancement-type MOS transistor is employed as selection transistor 11, its gate is applied with the ground potential when data is written in the EPROM cell 10, and is applied with a bias potential when data is read out of the EPROM cell 10.

The input terminal of a read circuit 13 is connected to the node A. One end of a MOS transistor for writing 14 is connected to the point at which selection transistor 11 and storage transistor 12 are connected together.

In circuit shown in FIG. 5, data is written into or read out of the EPROM cell 10 in a similar manner to that of a conventional circuit. When data is written in the EPROM cell 10, a high write voltage Vpp is applied to that end of write transistor 14 which is opposite to the above-mentioned one end, and a write control signal which is at the same voltage level as the write voltage Vpp is applied to the gate of write transistor 14. Simultaneously, the write voltage Vpp is applied to the gate of storage transistor 12. At the time, selection transistor 11 electrically disconnects the node A and storage transistor 12 from each other. When data is read out of the EPROM cell 10, write transistor 14 is turned off, and a read voltage (which is at the same level as the power source potential Vcc) is applied to the gate of storage transistor 12. As a result, the storage transistor 12 is turned on or off in accordance with the threshold voltage determined by the state of the storage transistor 12 (i.e., a data-written state or data-empty state of the storage transistor 12). Accordingly, the data read out of the EPROM cell 10 appears at node A.

Before the circuit shown in FIG. 5 is turned on, the connection point (i.e., node B) between the drain of the first p-channel MOS transistor P1 and the capacitor C is at the "L" level. When the circuit is turned on, the potential difference between the power source and node B becomes greater than the threshold voltage Vth of the first p-channel MOS transistor P1. Since, therefore, the first p-channel MOS transistor P1 is turned on, a charging current flows through the capacitor C. Assuming that the first MOS transistor P1 and each second MOS transistor P2 are of the same size, the same amount of current as that flowing through the first p-channel MOS transistor P1 flows from each second p-channel MOS transistor P2 to node A. Accordingly, node A is pre-charged.

One feature of the FIG. 5 circuit is that, when the power source is turned on, the potential at node B rises from Vcc to Vth, regardless of the rise time of the power source. Like node B, therefore, node A is supplied with that amount of current which corresponds to the total amount of charge expressed by $Q = C(Vcc - Vth)$. If node A is in a high-impedance state (in other words, if data is written in the EPROM cell 10), node A never fails to be pre-charged at the "H" level.

Another feature of the FIG. 5 circuit is that no d.c. current flows through transistors P1 and P2 in the stationary state established after the power source is turned on (i.e., the state where the potential at node B exceeds [Vcc − Vth] and transistors P1 and P2 are therefore kept in the ON state, and where the amount Q of charges in the capacitor C is C[Vcc − Vth]). Since no d.c. current flows through transistors P1 and P2 in this stationary state, the stand-by current with which entry of a defective address is waited for (such a stand-by current is characteristic of a CMOS circuit) becomes zero. Therefore, the power consumption can be reduced.

The amount Q of charge can be increased by increasing the capacitance of the capacitor C, but this approach is not practical since it inevitably increases the chip area, as mentioned above. In the present invention, therefore, the conductance of the MOS transistor P2 is set greater than that of the MOS transistor P1. By so doing, the amount Q of charge can be increased, without resulting in an increase in the chip area. By way of example, let it be assumed that the ratio of the channel width W to the channel length L is determined to be 1 for MOS transistor P1, and that the ratio of the channel width W to the channel length L is determined to be m ($m \geq 1$) for MOS transistor P2. In this case, the amount of charge flowing through MOS transistor P2 is given by mQ, due to the principles of a current mirror.

To store data corresponding to one bit of an address, it is necessary to employ one second p-channel MOS transistor P2, one EPROM cell 10, one read circuit 13, and one write transistor 14. However, since the entire memory only requires a single p-channel MOS transistor P1 and a single capacitor C, it does not occupy a wide chip area.

In connection with the circuit shown in FIG. 5, reference was made of the case where node A is precharged to the "H" level. However, node A can be precharged to the "L" level by employing such a circuit as is shown in FIG. 6.

Figure 1:
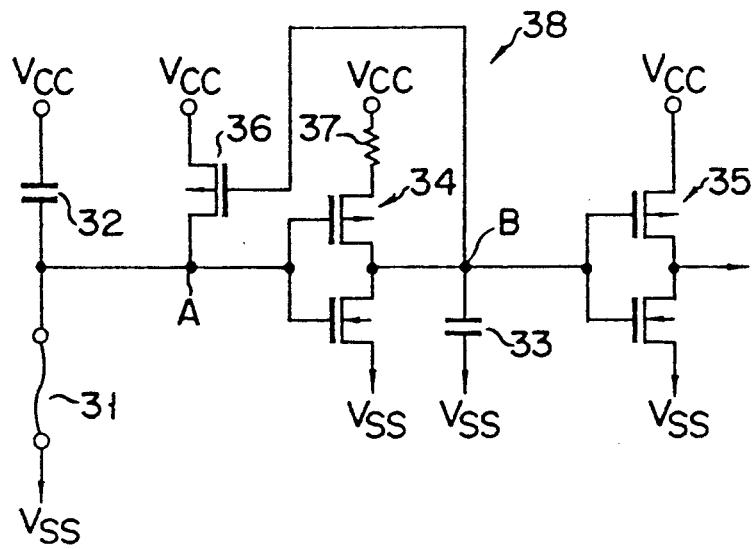
FIGS. 1 through 3 are circuit diagrams showing conventional semiconductor integrated circuits.
Figure 2:
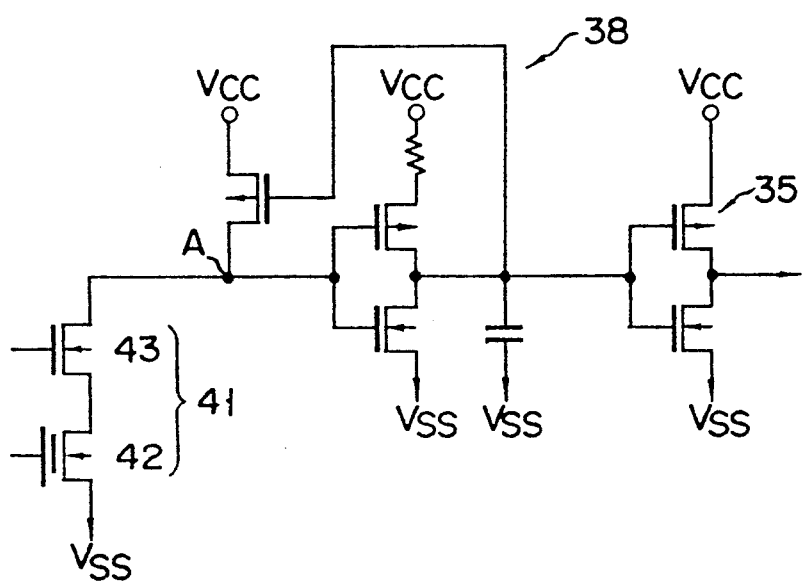
Figure 3:
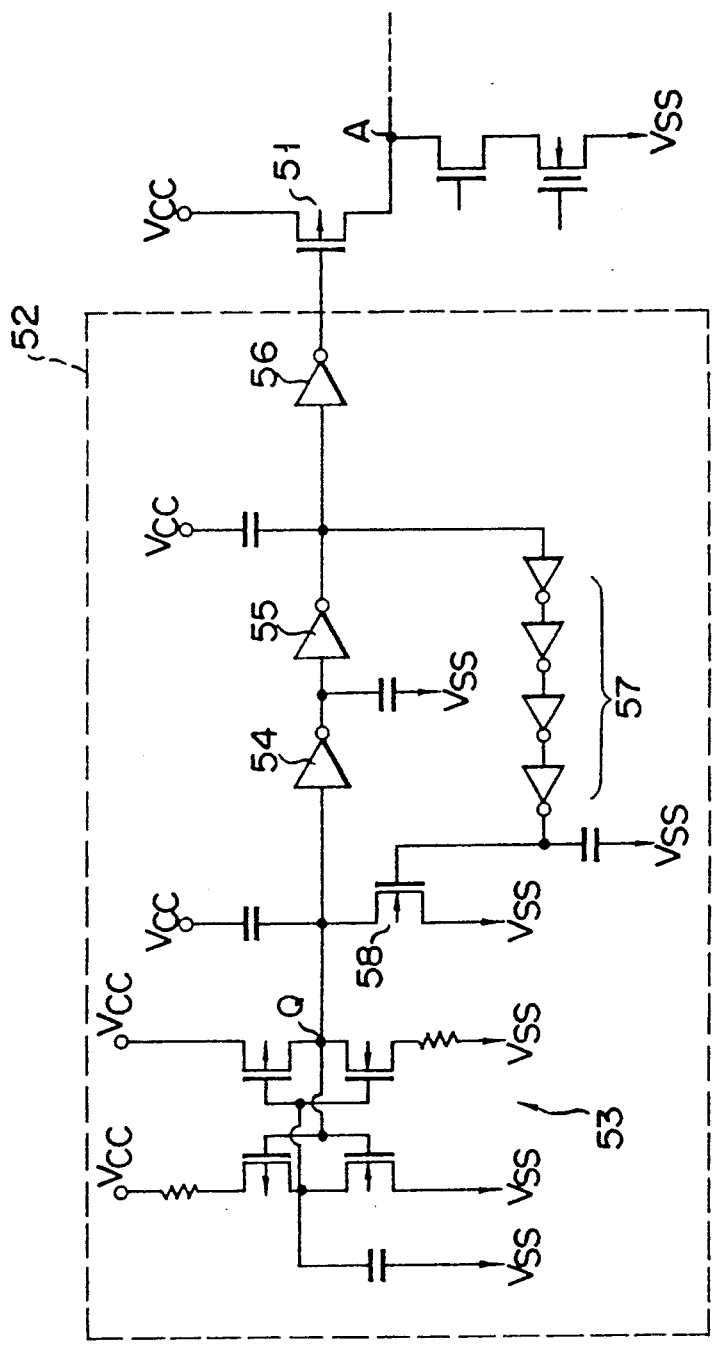
Figure 4A:
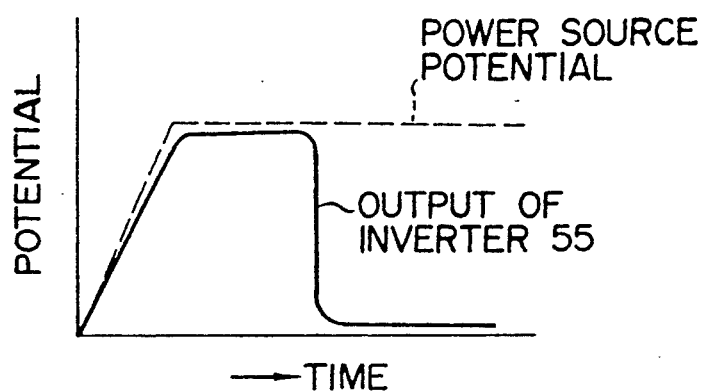
FIGS. 4A and 4B are graphs illustrating the operation of the conventional semiconductor integrated circuit shown in FIG. 3.
Figure 4B:
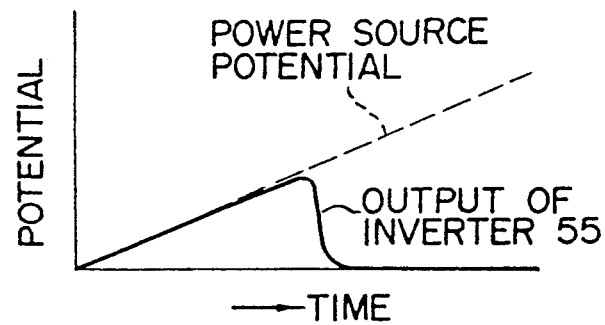
Figure 6:
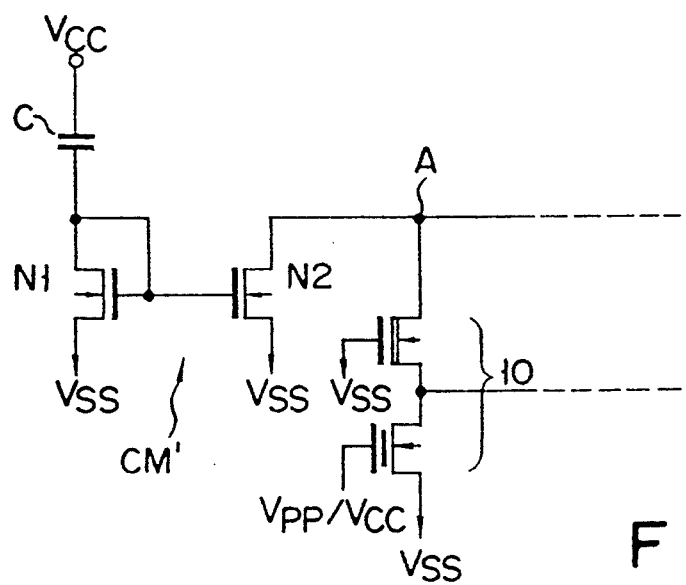
FIG. 6 is a circuit diagram showing a semiconductor integrated circuit according to the second embodiment of the present invention.

In the circuit shown in FIG. 6, the output-side transistor N2 of an n-channel current mirror circuit CM' is connected between node A and a ground potential point Vss, and a capacitor C is connected between a power source potential point Vcc and the drain of the input-side transistor N1 of the current mirror circuit CM'. With this circuit arrangement, node A can be discharged to the "L" level when the power source is turned on. In FIG. 6, like reference numerals and symbols represent like structural elements shown in FIG. 5.

In the embodiments shown in FIGS. 5 and 6, the node, which is pre-charged or discharged when the power source is turned on, is connected to the EPROM cell 10 that stores data regarding a defective address of a redundancy circuit. However, this in no way limits the present invention. For example, it is possible to precharge or discharge a node which is connected to a nonvolatile memory cell that stores information regarding a redundancy circuit. More specifically, the node precharged or discharged may be a node which is connected to an EPROM cell that stores data representing whether or not a redundancy circuit should be used, a node which is connected to a PROM cell that stores redundancy defective data, or a node which is connected to a PROM cell that stores signature data representing the presence or absence of a redundancy circuit. In short, the present invention is applicable to an integrated circuit wherein a given node has to be set to a predetermined potential level when the power source is turned on.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
   a first MOS transistor which has one current path connected to a first power source, and has a gate and another current path connected together;
   a capacitor element connected between a second power source and said another current path of the first MOS transistor;
   a first node which is connected to said another current path of the first MOS transistor, the potential of said first node varying with time;
   a second MOS transistor which is of the same conductivity type as the first MOS transistor and which has one current path connected to the first power source, a gate connected to the gate of the first MOS transistor; and
   a second node which is connected to another current path of the second MOS transistor and is precharged at a predetermined potential level by a current flowing from said another current path of the second MOS transistor.

2. A semiconductor integrated circuit according to claim 1, wherein said first MOS transistor having a gate connected to a drain thereof jointly constitutes a current mirror circuit with said second MOS transistor.

3. A semiconductor integrated circuit according to claim 1, wherein the ratio of the channel width to the channel length for said second MOS transistor is greater than the ratio of the channel width to the channel length for said first MOS transistor.

* * * * *